(12) United States Patent
Li et al.

(10) Patent No.: US 12,419,029 B2
(45) Date of Patent: Sep. 16, 2025

(54) SEMICONDUCTOR STRUCTURE AND FORMING METHOD THEREOF

(71) Applicant: CHANGXIN MEMORY TECHNOLOGIES, INC., Hefei (CN)

(72) Inventors: Sheng Li, Hefei (CN); Yang Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 711 days.

(21) Appl. No.: 17/647,816

(22) Filed: Jan. 12, 2022

(65) Prior Publication Data

US 2022/0139926 A1 May 5, 2022

Related U.S. Application Data

(63) Continuation of application No. PCT/CN2021/107866, filed on Jul. 22, 2021.

(30) Foreign Application Priority Data

Oct. 26, 2020 (CN) .......................... 202011155898.1

(51) Int. Cl.
 *H10B 12/00* (2023.01)
(52) U.S. Cl.
 CPC ......... *H10B 12/09* (2023.02); *H10B 12/0335* (2023.02); *H10B 12/315* (2023.02); *H10B 12/50* (2023.02)
(58) Field of Classification Search
 CPC .... H10B 12/09; H10B 12/0335; H10B 12/50; H10B 12/315
 See application file for complete search history.

(56) References Cited

U.S. PATENT DOCUMENTS

| | | | |
|---|---|---|---|
| 6,531,758 B2 | 3/2003 | Shin | |
| 6,656,791 B2 | 12/2003 | Shin | |
| 7,550,363 B2 * | 6/2009 | Lee | ................... H01L 21/76229 |
| | | | 438/424 |

(Continued)

FOREIGN PATENT DOCUMENTS

| | | |
|---|---|---|
| CN | 103197513 A | 7/2013 |
| CN | 109755245 A | 5/2019 |
| KR | 100884346 B1 | 2/2009 |

OTHER PUBLICATIONS

Merriam-Webster OnLine Dictionary Definition of FILL. No Date.*

*Primary Examiner* — Nathan W Ha
(74) *Attorney, Agent, or Firm* — SYNCODA LLC; Feng Ma

(57) ABSTRACT

A forming method of a semiconductor structure includes: providing a substrate including an array area and a peripheral area; forming a first insulating dielectric layer in the array area and the peripheral area at the same time, and etching the first insulating dielectric layer and the component dielectric layer in the array area; filling the plurality of trenches; performing back etching on the reference isolation structure and the first insulating dielectric layer; forming a second insulating dielectric layer in the array area and the peripheral area; patterning the second insulating dielectric layer; removing the first insulating dielectric layer in the array area; and removing the second insulating dielectric layer to form a contact material in the contact window.

11 Claims, 20 Drawing Sheets

(56) References Cited

U.S. PATENT DOCUMENTS

| | | |
|---|---|---|
| 8,435,876 B2 | 5/2013 | Park |
| 9,330,960 B2 | 5/2016 | Cho |
| 9,431,476 B2 | 8/2016 | Cho et al. |
| 10,593,676 B2 | 3/2020 | Lee et al. |
| 2002/0038897 A1* | 4/2002 | Tuan .................. H10B 69/00 257/E21.244 |
| 2002/0060351 A1 | 5/2002 | Shin |
| 2003/0119243 A1 | 6/2003 | Shin |
| 2003/0232483 A1* | 12/2003 | Fujiishi ............... H10B 12/033 257/E27.088 |
| 2012/0142179 A1 | 6/2012 | Park |
| 2014/0361403 A1 | 12/2014 | Cho |
| 2016/0225845 A1 | 8/2016 | Cho et al. |
| 2019/0139961 A1 | 5/2019 | Lee et al. |

* cited by examiner

SEMICONDUCTOR STRUCTURE AND FORMING METHOD THEREOF

CROSS-REFERENCE TO RELATED APPLICATIONS

The present application is a continuation of International Application No. PCT/CN2021/107866 filed on Jul. 22, 2021, which claims priority to Chinese Patent Application No. 202011155898.1 filed on Oct. 26, 2020. The disclosures of the above-referenced applications are hereby incorporated by reference in their entirety.

BACKGROUND

A Dynamic Random-Access Memory (DRAM) is widely used in mobile devices such as mobile phones and tablet computers because of its advantages like small volume, high integration degree, and fast transmission speed, etc. As a core part of the DRAM, a capacitor is mainly configured to store charges.

SUMMARY

The present disclosure relates to the technical field of semiconductors, and in particular relates to a semiconductor structure and a forming method thereof.

The purpose of the disclosure is to overcome the disadvantages in the above traditional art and to provide a semiconductor structure and a forming method thereof, which may prevent the occurrence of structural defects and improve the product yield.

According to an aspect of the disclosure, a forming method of a semiconductor structure is provided, which may include the following operations.

A substrate is provided, the substrate including an array area and a peripheral area, and a component dielectric layer being formed on the array area.

A first insulating dielectric layer is formed in the array area and the peripheral area at the same time, and the first insulating dielectric layer and the component dielectric layer in the array area are etched to form a plurality of trenches distributed at intervals.

The plurality of trenches are filled to form a reference isolation structure.

Back etching on the reference isolation structure and the first insulating dielectric layer is performed to form an isolation structure.

A second insulating dielectric layer is formed in the array area and the peripheral area, and the second insulating dielectric layer is located on one side, away from the substrate, of the isolation structure and the first insulating dielectric layer.

The second insulating dielectric layer is patterned, and the second insulating layer in the array area is removed to expose the first insulating dielectric layer in the array area.

The first insulating dielectric layer in the array area is removed to form a contact window.

The second insulating dielectric layer is removed to form a contact material in the contact window.

According to another aspect of the disclosure, a semiconductor structure is provided, which is formed by the above forming method of the semiconductor structure.

It is to be understood that the above general descriptions and detail descriptions below are merely exemplary and explanatory, which may not limit the disclosure.

BRIEF DESCRIPTION OF THE DRAWINGS

The drawings here, which are incorporated in and constitute a part of this disclosure, illustrate embodiments consistent with the disclosure and, together with the description, serve to explain the principles of the disclosure. It is apparent that the drawings described below are only some embodiments of the disclosure. Other drawings may further be obtained by those of ordinary skilled in the art according to these drawings without creative work.

DETAILED DESCRIPTION

Figure 1:
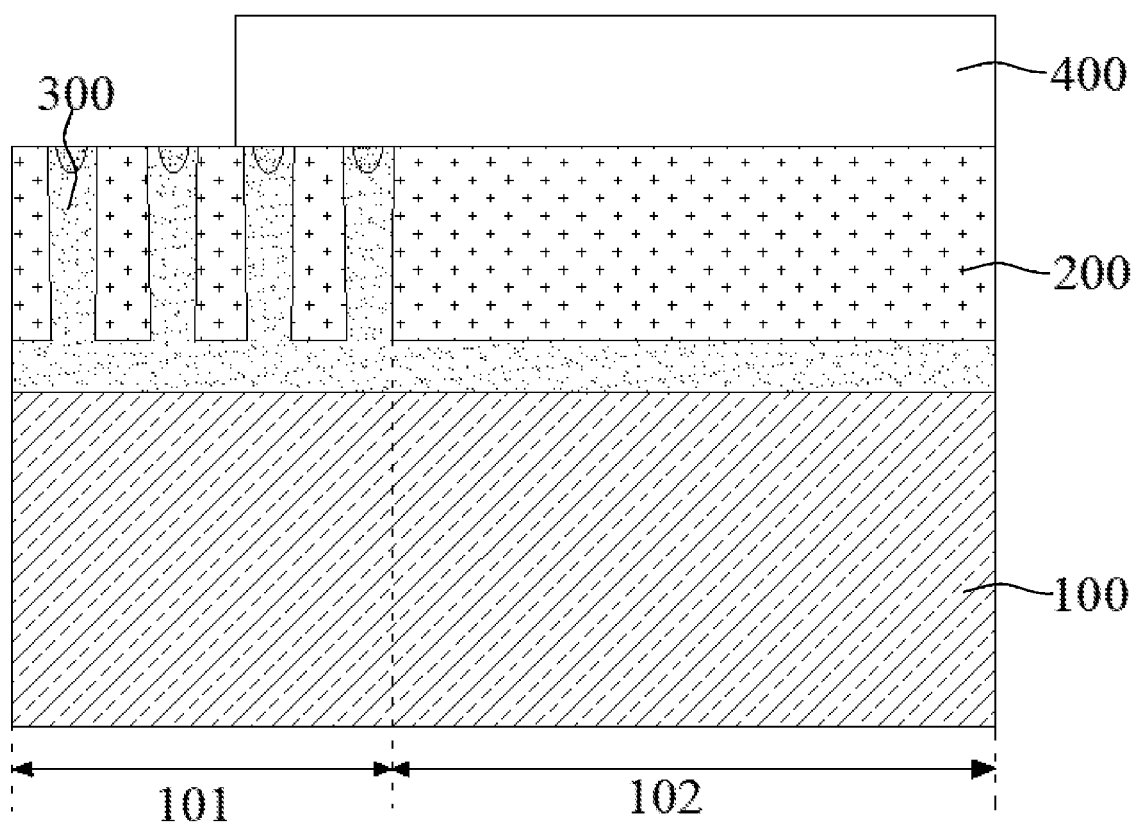
FIG. 1 is a schematic diagram of a semiconductor structure in some implementations.

Exemplary implementation modes are described more comprehensively with reference to the drawings at present. However, the exemplary implementation modes may be implemented in many forms, and should not be understood as limitation to implementation modes described here. On the contrary, these provided implementation modes enable the disclosure to be more comprehensive and complete, and conceptions of the exemplary implementation modes are comprehensively conveyed to those skilled in the art. The same signs in the drawings show same or similar structures, so that detailed descriptions of them are omitted.

In the figures, the reference numbers are as follows: 100. Substrate; 101. Array area; 102. Peripheral area; 200. Insulating dielectric layer; 300. Isolation dielectric layer; 400. Photoresist layer; 1. Substrate; 11. Array area; 12. Peripheral area; 2. Component dielectric layer; 3. First insulating dielectric layer; 31. Trench; 311. Reference isolation structure; 3111. Air gap; 312. Isolation structure; 32. Contact window; 4. Second insulating dielectric layer; 41. Etching opening; 5. Contact material; 6. Photoresist layer; 7. Capacitive plug; and 8. Dielectric layer.

Although this specification uses relative terms such as "upper" and "lower" to describe the relative relationship of one assembly of the icon to another, these terms are used in this specification only for convenience, for example, the example direction described in the drawings. It is understood that, if the device of the icon is turned upside down, the assembly described as "upper" will become the assembly described as "lower". When a structure is "upper" of other structures, it may mean that this structure is integrally formed on other structures, or that this structure is "directly" on other structures or this structure is "indirectly" on other structures through another structure.

Terms "one", "a/an", "the" and "described" are used to indicate one or more elements/constituent parts/etc. Terms "include" and "have" are used to express an open sense of including and to indicate that additional elements/constituent parts/and the like may exist in addition to the listed elements/constituent parts/and the like. Terms such as "first" and "second" are merely used as signs, but not quantitative limitations to its objects.

Generally, when a capacitive contact window is manufactured and formed, wet etching is required to remove an insulating dielectric material in a partial area. In this process, an etching solution is easy to enter other areas, thus damaging structures of other areas and causing device defects.

It is to be noted that information disclosed in the above background part is merely used for enhancing understanding of the background of the disclosure, so that information, which does not constitute the conventional art known by those of ordinary skill in the art, may be included.

Figure 2:
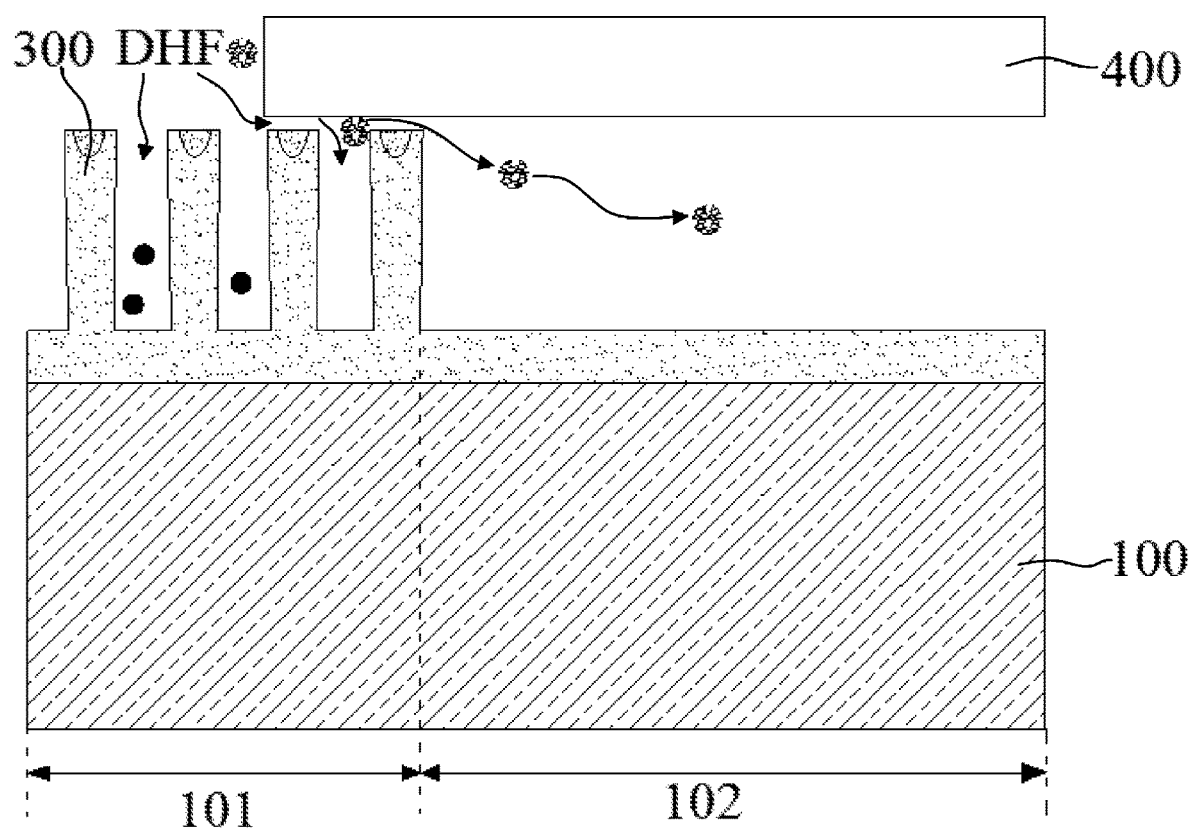
FIG. 2 is a schematic diagram of forming a capacitive contact window in some implementations.

In some implementations, as shown in FIG. 1 and FIG. 2, a semiconductor structure may mainly include a substrate 100, an insulating dielectric layer 200 and an isolation dielectric layer 300, and the substrate 100 may include an array area 101 and a peripheral area 102. When a capacitive contact window is formed, a wet etching process is required to remove the insulating dielectric layer 200 located in the array area 101. In the process, in order to prevent an etching solution from damaging the peripheral area 102, the insulating dielectric layer 200 located in the peripheral area 102 is usually covered with a photoresist layer 400. However, in the etching process, the etching solution will react with the photoresist layer 400 to destroy the photoresist layer 400, so that the etching solution enters the peripheral area 102, and then damage the insulating dielectric layer 200 of the peripheral area 102 and cause defects. At the same time, the photoresist layer 400 is easy to generate carbon ions after being eroded by the etching solution, so that the carbon ions enter the capacitive contact window and further cause defects.

Figure 3:
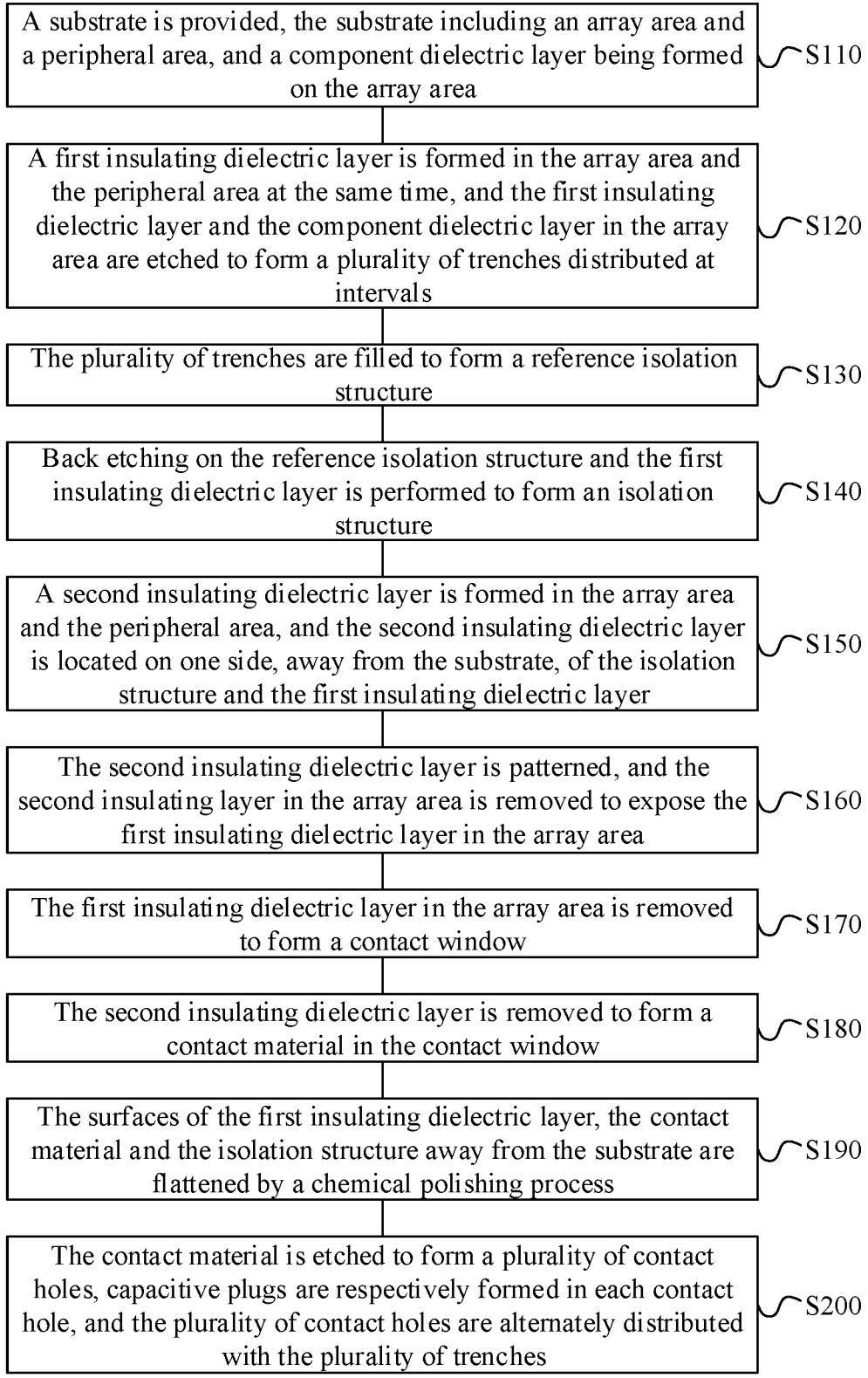
FIG. 3 is a flowchart of a forming method of a semiconductor structure in embodiments of the disclosure.

The implementation mode of the disclosure provides a forming method of a semiconductor structure, and, as shown in FIG. 3, the forming method may include S110-S180 below.

At S110, a substrate is provided, the substrate including an array area and a peripheral area, and a component dielectric layer being formed on the array area.

At S120, a first insulating dielectric layer is formed in the array area and the peripheral area at the same time, and the first insulating dielectric layer and the component dielectric layer in the array area are etched to form a plurality of trenches distributed at intervals.

At S130, the plurality of trenches are filled to form a reference isolation structure.

At S140, back etching on the reference isolation structure and the first insulating dielectric layer is performed to form an isolation structure.

At S150, a second insulating dielectric layer is formed in the array area and the peripheral area, and the second insulating dielectric layer is located on one side, away from the substrate, of the isolation structure and the first insulating dielectric layer.

At S160, the second insulating dielectric layer is patterned, and the second insulating layer in the array area is removed to expose the first insulating dielectric layer in the array area.

At S170, the first insulating dielectric layer in the array area is removed to form a contact window.

At S180, the second insulating dielectric layer is removed to form a contact material in the contact window.

According to the forming method of the semiconductor structure of the disclosure, since the second insulating dielectric layer is formed on the top surface of the isolation structure, the isolation structure is in contact connection with the second insulating dielectric layer. When the first insulating dielectric layer in the array area is removed, the isolation structure and the second insulating dielectric layer may form a barrier structure to prevent the etching solution from entering the peripheral area, so as to prevent the etching solution from entering the peripheral area, avoid the damage of the structure in the peripheral area by the etching solution, prevent the generation of structural defects and improve the product yield. Moreover, after the contact material is formed in each contact window, each contact window may be separated by the isolation structure, so as to prevent the coupling of the contact materials in the adjacent contact windows and reduce the short-circuiting risk of a device. At the same time, the contact material may be used as a capacitive contact plug, which may be in contact connection with a capacitor to store charges collected in the capacitor.

Various steps of the forming method in the implementation mode of the disclosure are described in detail below.

As shown in FIG. 3, in S110, the substrate is provided, the substrate includes the array area and the peripheral area, and the component dielectric layer is formed on the array area.

Figure 4:
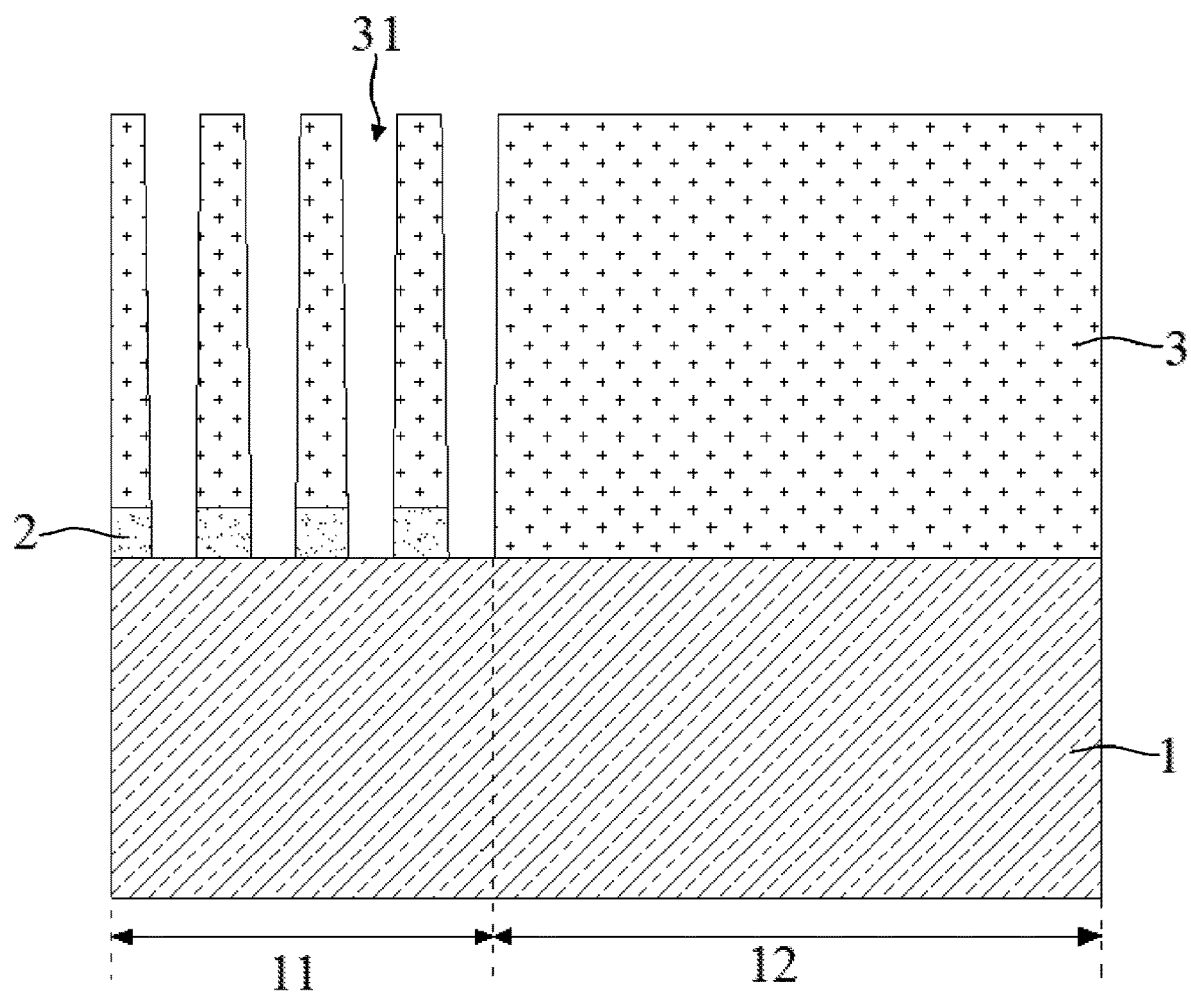
FIG. 4 is a schematic structural diagram after S120 is completed in an embodiment of the disclosure.
Figure 5:
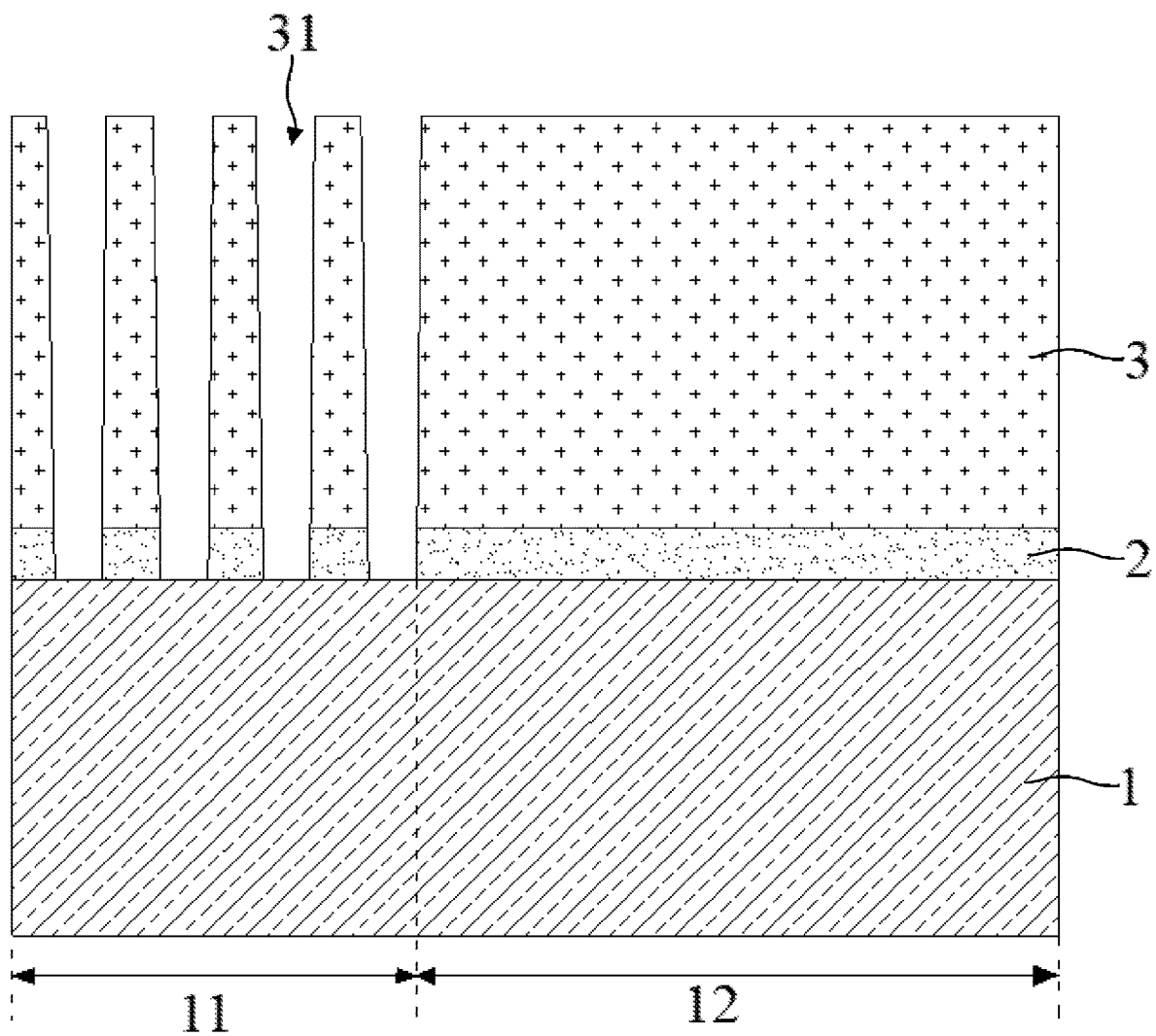
FIG. 5 is a schematic structural diagram after S120 is completed in another embodiment of the disclosure.

As shown in FIG. 4-FIG. 5, the substrate 1 may be a flat plate structure, which may be a rectangular, circular, elliptical, polygonal or irregular pattern, and its material may be silicon or other semiconductor materials. Here, the shape and material of the substrate 1 are not specially limited.

The substrate 1 may include the array area 11 and the peripheral area 12, the array area 11 and the peripheral area 12 may be adjacent, and the peripheral area 12 may surround the periphery of the array area 11. The array area 11 may be configured to form a bit line structure and an array capacitor that are arranged at intervals, and the peripheral area 12 may be configured to form a transistor. Since the content of the invention is not involved, it will not be elaborated in detail here. For example, the array area 11 may be a circular area, a rectangular area or an irregular graphic area. Certainly, it may also be an area of other shapes, which is not specially limited here. The peripheral area 12 may be an annular area and may surround the periphery of the array area 11. It may be an annular area, a rectangular annular area or an annular area of other shapes, which will not be listed one by one here.

As shown in FIG. 4, the component dielectric layer 2 may be formed on the surface of the substrate 1 and may be located in the array area 11. It may be a thin film formed on the surface of the substrate 1. The component dielectric layer 2 may be formed on the surface of the array area 11 of the substrate 1 by vacuum evaporation, magnetron sputtering, chemical vapor deposition, physical vapor deposition or atomic layer deposition. The component dielectric layer 2 may be composed of an insulating material, and the bit line structures in the array area 11 may be separated from the capacitors in a capacitor array through the component dielectric layer 2 to avoid short circuiting. For example, the material may be silicon nitride and, of course, other insulating materials, which will not be listed one by one here.

It is to be noted that, as shown in FIG. 5, the peripheral area 12 may also be formed with the component dielectric layer 2 through which various transistors in the peripheral area 12 may be separated. The component dielectric layer 2 of the peripheral area 12 and the component dielectric layer 2 of the array area 11 may be formed simultaneously by the same process. Of course, the component dielectric layer 2 of the peripheral area 12 and the component dielectric layer 2 of the array area 11 may also be respectively formed by different processes, which are not specially limited here.

As shown in FIG. 3, in S120, the first insulating dielectric layer is formed in the array area and the peripheral area at the same time, and the first insulating dielectric layer and the component dielectric layer in the array area are etched to form the plurality of trenches distributed at intervals.

The first insulating dielectric layer 3 covering the substrate 1 may be formed, the first insulating dielectric layer 3 may cover the array area 11 and the peripheral area 12 at the same time, that is, the first insulating dielectric layer 3 may cover the surface, away from the substrate 1, of the component dielectric layer 2 and the surface of the peripheral area 12 of the substrate 1.

For example, the first insulating dielectric layer 3 may be formed on the surface, away from the substrate 1, of the component dielectric layer and the surface of the peripheral area 12 of the substrate 1 by vacuum evaporation, magnetron sputtering, chemical vapor deposition, physical vapor deposition or atomic layer deposition. Of course, the first insulating dielectric layer 3 may also be formed in other ways, which will not be listed one by one here. An orthographic projection of the first insulating dielectric layer 3 on the substrate 1 may coincide with the boundary of the substrate 1, and its material may be silicon oxide, etc., which is not specially limited here.

The first insulating dielectric layer 3 and the component dielectric layer 2 located in the array area 11 may be etched by a non-isotropic etching process to form the plurality of trenches 31 distributed at intervals in the array area 11. Each trench 31 may penetrate through the first insulating dielectric layer 3 and the component dielectric layer 2, and may be communicated with the substrate 1. In an embodiment, the bit line structure may be arranged around each trench 31, each trench 31 may be a high aspect ratio structure, and one side of the trench 31, away from the substrate 1, may be much higher than one side, away from the substrate 1, of the bit line structure, so as to prevent damage to the surface of the bit line structure during the etching process when the contact window is formed. The structure after S120 is completed is shown in FIG. 4 and FIG. 5.

As shown in FIG. 3, in S130, the trench is filled to form the reference isolation structure.

Figure 6:
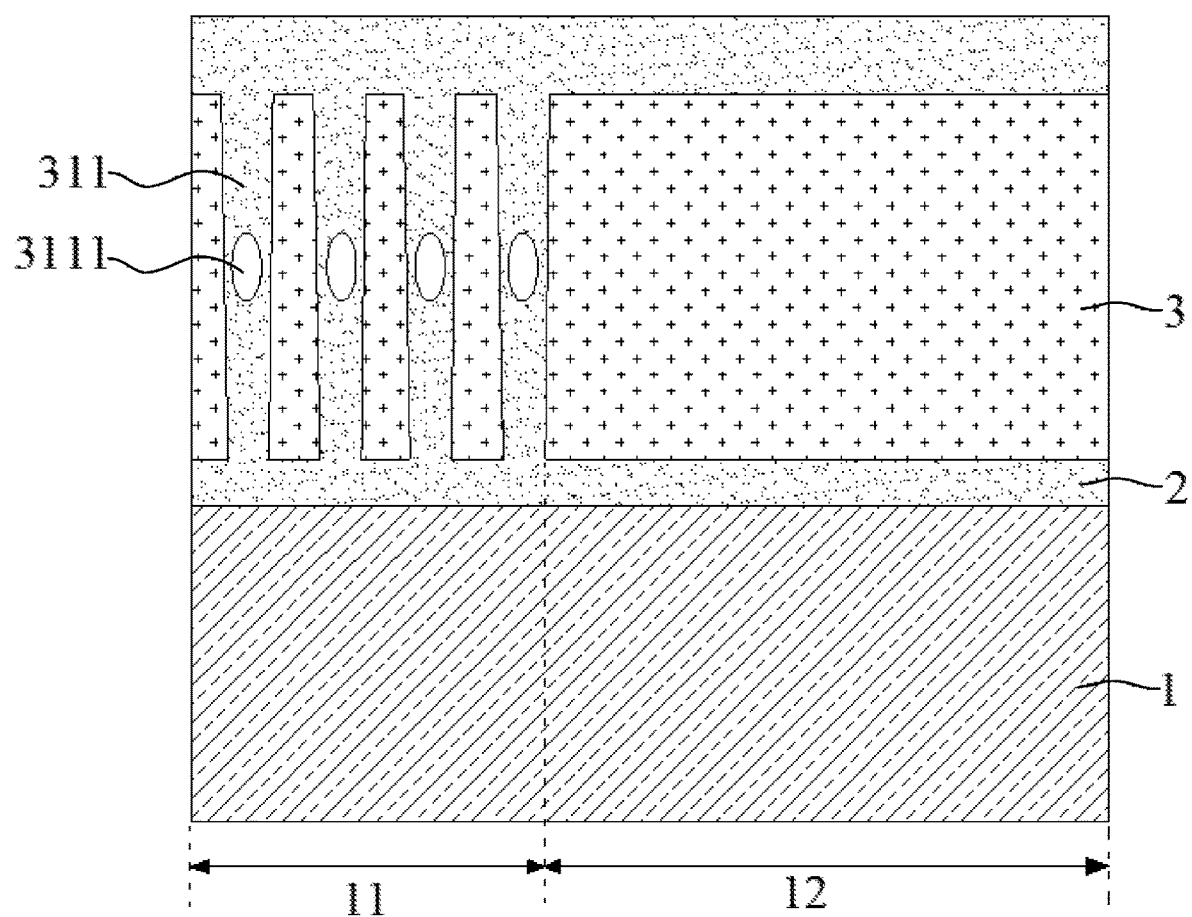
FIG. 6 is a schematic structural diagram of an isolation structure in an embodiment of the disclosure.

As shown in FIG. 6, the isolation dielectric material may be respectively deposited in each trench 31 by an atomic layer deposition process or a chemical vapor deposition process, etc., and the isolation dielectric material may fill each trench 31 full to form the reference isolation structure 311. The reference isolation structure 311 may include an isolation dielectric material in each trench 31. The isolation dielectric material may be the same as that of the component dielectric layer 2, and the isolation dielectric material in each trench 31 may be in contact connection with the component dielectric layer 2.

Each trench 31 may be of a high aspect ratio structure. When the isolation dielectric material is deposited in the trench 31, it is easy to form an air gap 3111. In the process of forming the reference isolation layer 311, the isolation dielectric material may be deposited in each trench 31 at the same time through the atomic layer deposition process or the chemical vapor deposition process, etc., until the air gap 3111 appears. In the process, the position where the air gap 3111 appears may be controlled by controlling the flow of each deposited material. Meanwhile, by controlling the deposition rate of each material, the position of the air gap 3111 may be moved upward, so that the height of the air gap 3111 in the direction perpendicular to the substrate 1 is higher than the surface, away from the substrate 1, of the bit line structure, so as to prevent damage to the bit line structure in the subsequent back etching process.

In order to eliminate the air gap 3111 and improve the device reliability, in S140, back etching on the reference isolation structure and the first insulating dielectric layer is performed to form the isolation structure.

Figure 7:
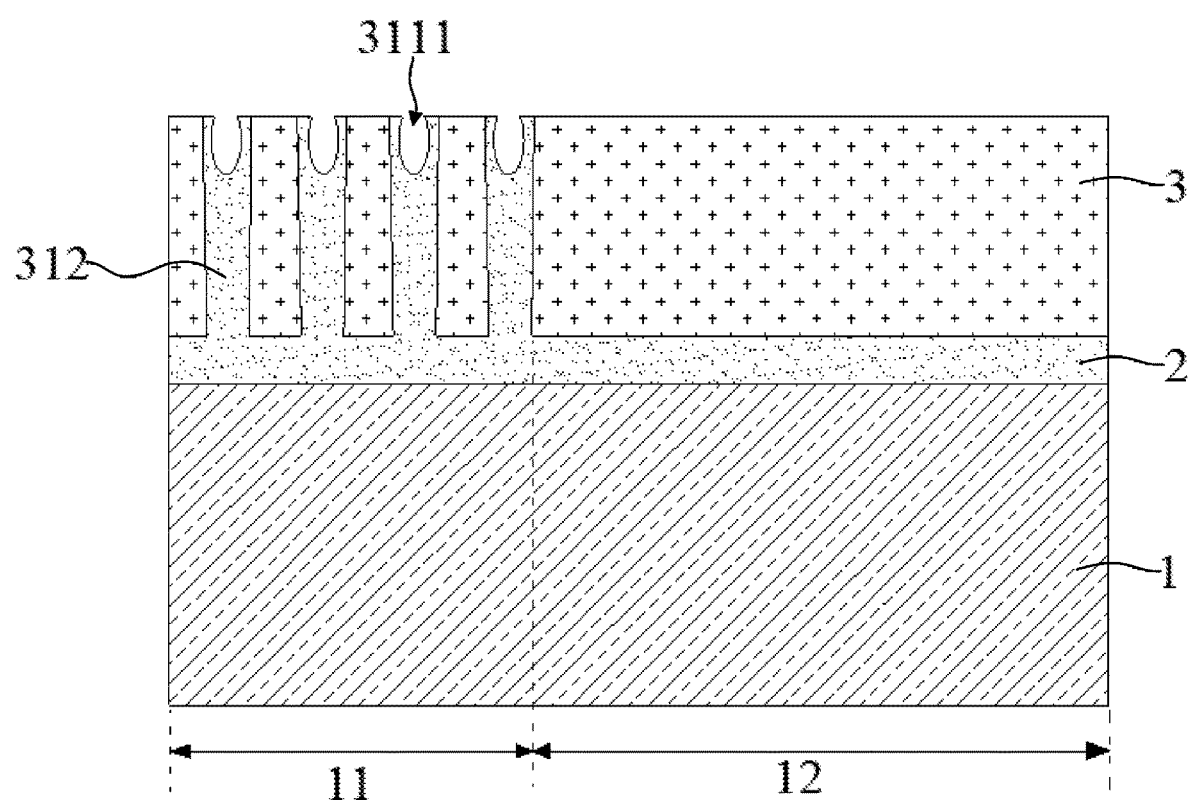
FIG. 7 is a schematic structural diagram after S140 is completed corresponding to FIG. 3.

As shown in FIG. 7, the reference isolation structure 311 and the first insulating dielectric layer 3 may be back etched by a non-isotropic etching or chemical polishing process to form an isolation structure 312. The isolation structure 312 may expose an opening of each air gap 3111, and the height of the isolation structure 312 formed after back etching may be greater than or equal to the height of the required bit line structure to avoid damaging the bit line structure during back etching.

As shown in FIG. 3, in S150, the second insulating dielectric layer is formed in the array area and the peripheral area, and the second insulating dielectric layer is located on one side, away from the substrate, of the isolation structure and the first insulating dielectric layer.

After the isolation structure 312 is formed, the second insulating dielectric layer may be formed on the top surface of the isolation structure 312 and the first insulating dielectric layer 3, and the second insulating dielectric layer may cover the array area and the peripheral area. The second insulating dielectric layer may be a thin film formed on the top surface of the isolation structure 312 and the first insulating dielectric layer 3. The second insulating dielectric layer may be formed by vacuum evaporation, magnetron sputtering, chemical vapor deposition, physical vapor deposition or atomic layer deposition. Of course, the second insulating dielectric layer may also be formed by other means. Here, the formation mode of the second insulating dielectric layer is not specially limited.

The material of the second insulating dielectric layer is not easy to react with the etching solution, and contacting with the etching solution will not damage its own structure. For example, the material may be silicon nitride, of course, or other materials that are not easy to react with the etching solution, which will not be listed one by one here.

Figure 8:
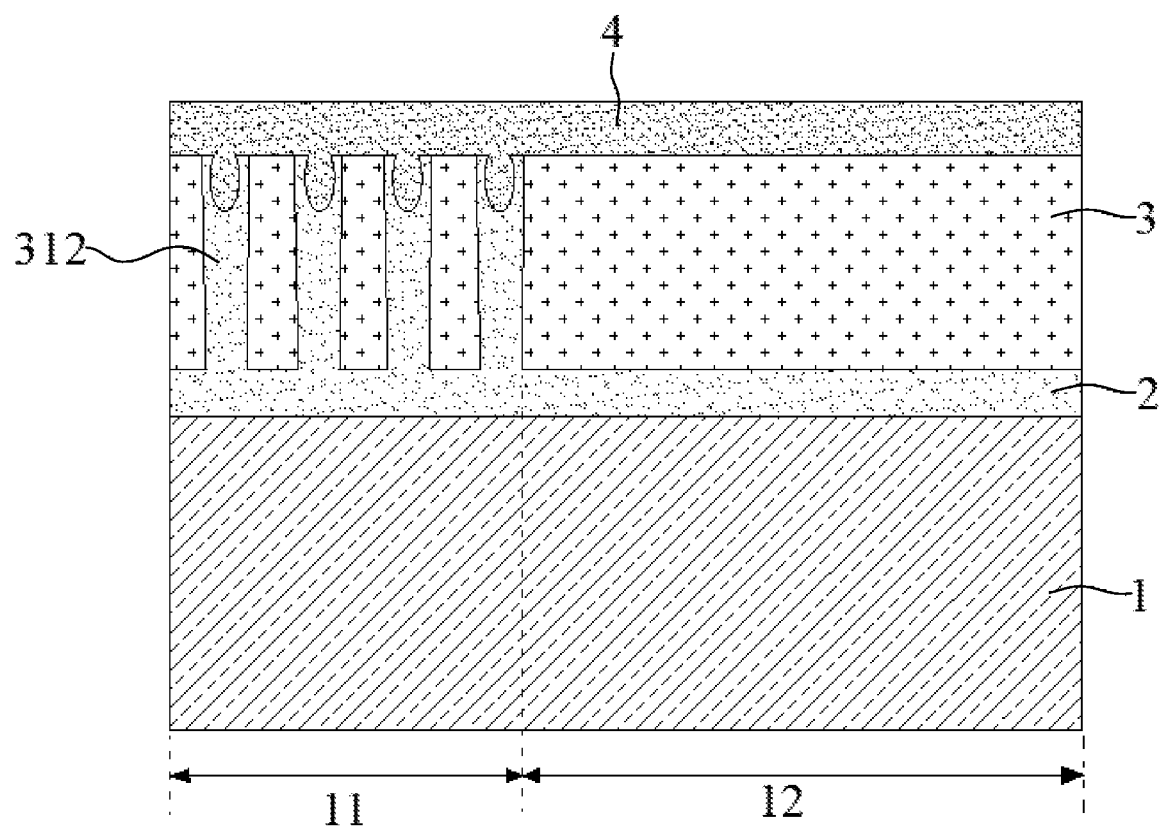
FIG. 8 is a schematic diagram of a second insulating dielectric layer in the first embodiment of the disclosure.

In the first implementation mode of the disclosure, as shown in FIG. 8, the second insulating dielectric layer 4 may fill the interior of the air gap 3111 full through the opening of the air gap 3111, so as to eliminate the air gap 3111 and improve the structural reliability.

Figure 9:
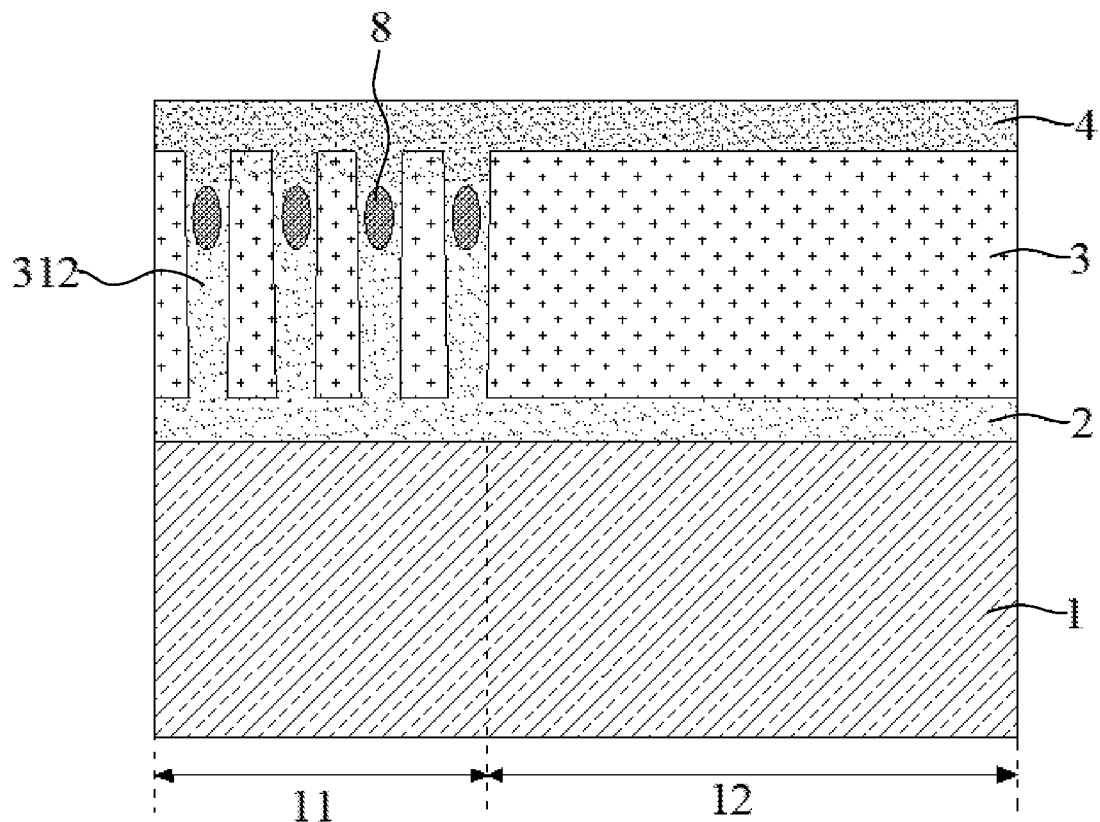
FIG. 9 is a schematic diagram of a second insulating dielectric layer in the second embodiment of the disclosure.

In the second implementation mode of the disclosure, as shown in FIG. 9, before the second insulating dielectric layer 4 is formed, an atomic layer deposition process may be used to form a dielectric layer 8 in the air gap 3111 through the opening of the air gap 3111. The dielectric layer 8 may fill the air gap 3111 fully, so as to eliminate the air gap 3111 and improve the device reliability.

The dielectric layer 8 may be composed of a material with a relatively high dielectric constant, which helps to prevent coupling of capacitive plugs in two adjacent contact windows. For example, the material of the dielectric layer 8 may be at least one of aluminum oxide, hafnium oxide, lanthanum oxide, titanium oxide, zirconium oxide, tantalum oxide, niobium oxide and strontium oxide. Of course, it may also be other materials with high dielectric constant, which will not be listed one by one here. It is to be noted that, the second insulating dielectric layer 4 may cover both the first insulating dielectric layer 3 and the dielectric layer 8 at the same time.

As shown in FIG. 3, in S160, the second insulating dielectric layer is patterned, and the second insulating layer in the array area is removed to expose the first insulating dielectric layer in the array area.

Figure 10:
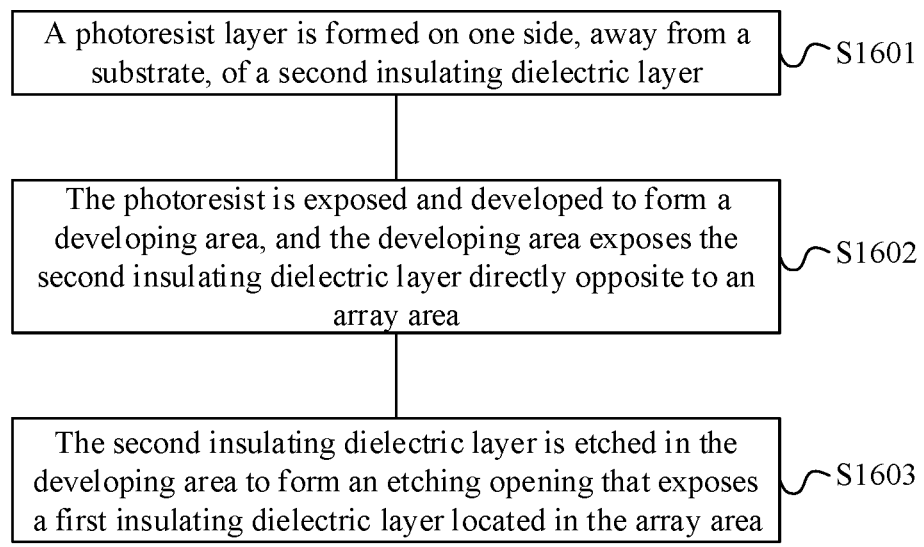
FIG. 10 is a flowchart corresponding to S160 in FIG. 3.

The second insulating dielectric layer 4 may be patterned by a dry etching process to remove the second insulating dielectric layer 4 located in the array area 11, so as to expose the first insulating dielectric layer 3 located in the array area 11 for etching the first insulating dielectric layer 3. In an embodiment, as shown in FIG. 10, S160 may include S1601-S1603 below.

At S1601, a photoresist layer is formed on one side, away from the substrate, of the second insulating dielectric layer.

The photoresist layer may be formed on one side, away from the substrate 1, of the second insulating dielectric layer 4 by spin coating or other means. The material of the photoresist layer may be positive photoresist or negative photoresist, which is not specially limited here.

At S1602, the photoresist is exposed and developed to form a developing area, and the developing area exposes the second insulating dielectric layer directly opposite to the array area.

Figure 11:
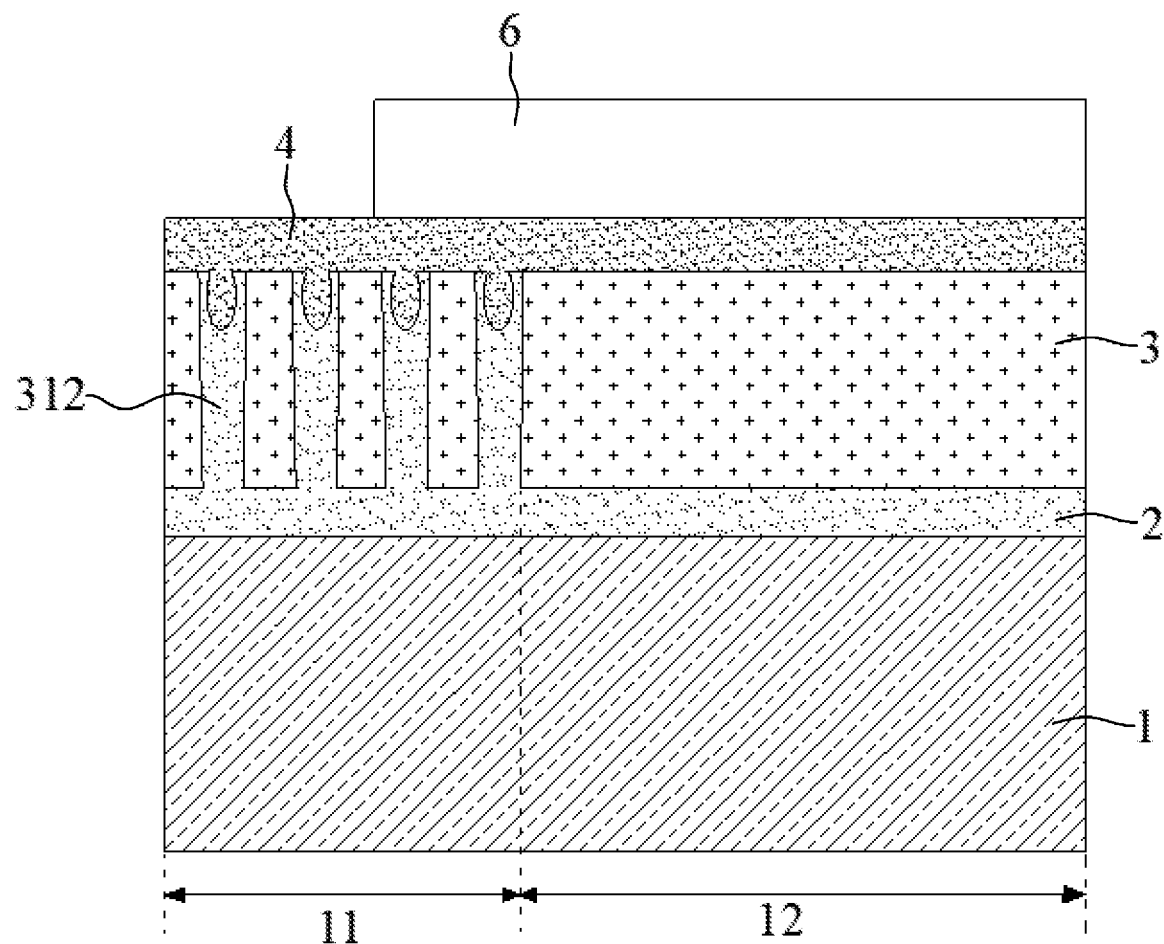
FIG. 11 is a schematic structural diagram after S1602 is completed in an embodiment of the disclosure.

As shown in FIG. 11, the photoresist layer 6 may be exposed by using a mask, and the pattern of the mask may be matched with the pattern required by the second insulating dielectric layer 4. Afterwards, the exposed photoresist layer 6 may be developed to form a developing area. The developing area may expose the second insulating dielectric layer 4, the pattern of the developing area may be the same as that required by the second insulating dielectric layer 4, and the shape and the size of the developing area may be the same as that of the array area 11.

At S1603, the second insulating dielectric layer is etched in the developing area to form an etching opening that exposes the first insulating dielectric layer located in the array area.

Figure 12:
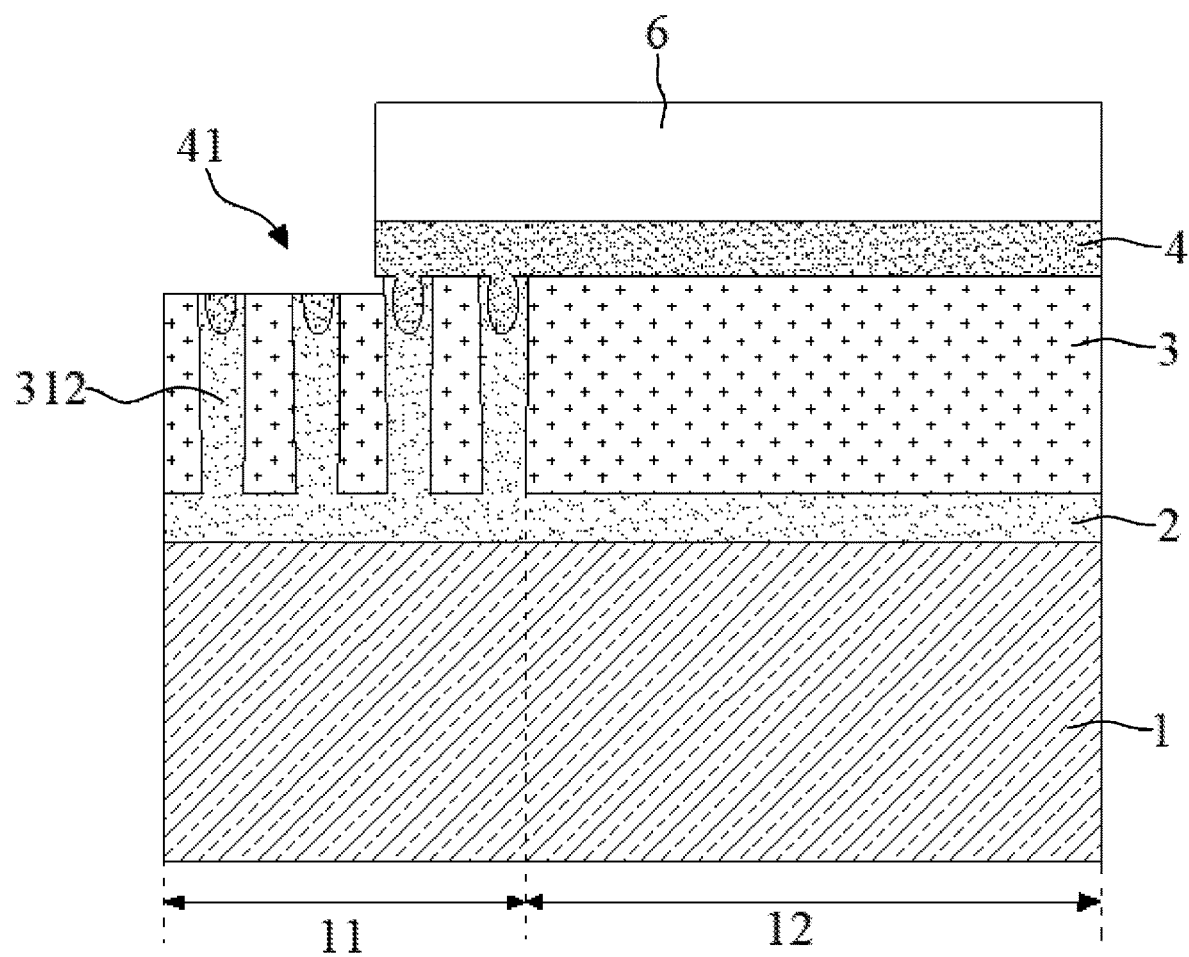
FIG. 12 is a schematic diagram of an etching opening in an embodiment of the disclosure.
Figure 13:
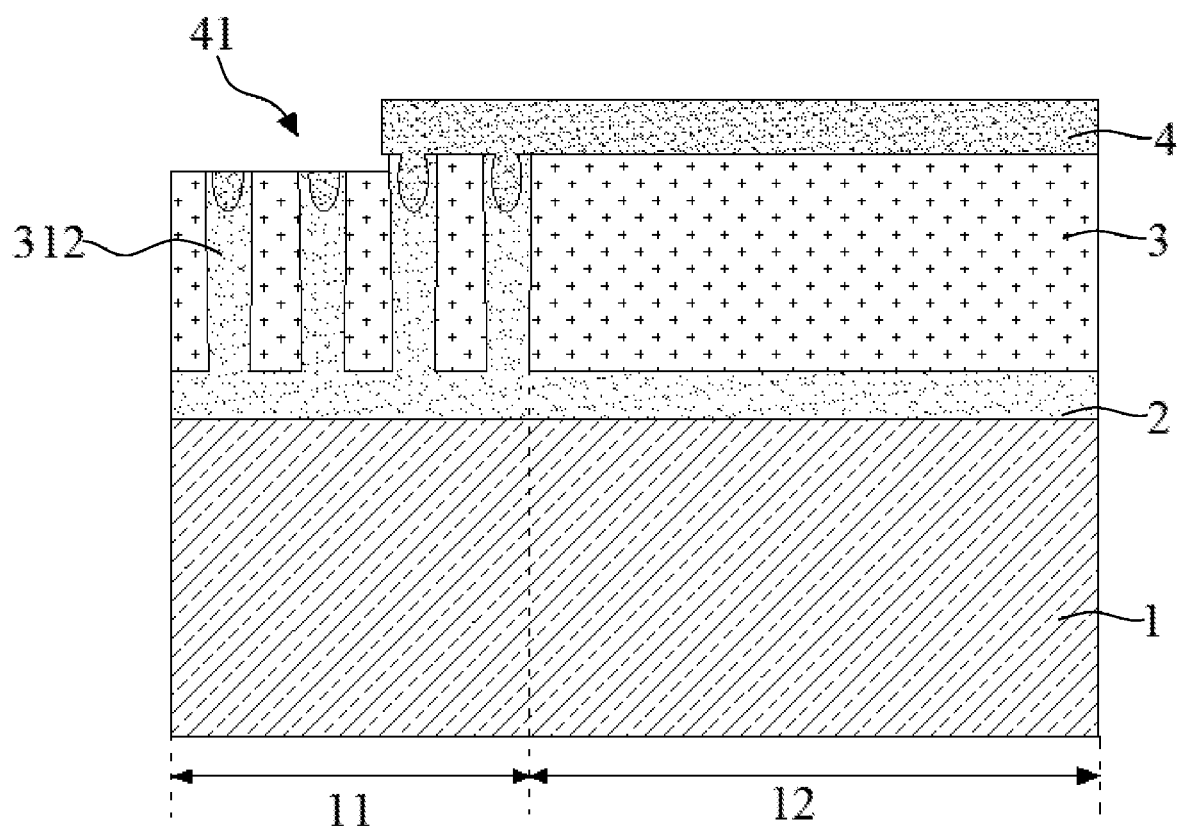
FIG. 13 is a schematic structural diagram after S1603 is completed in the first embodiment of the disclosure.
Figure 14:
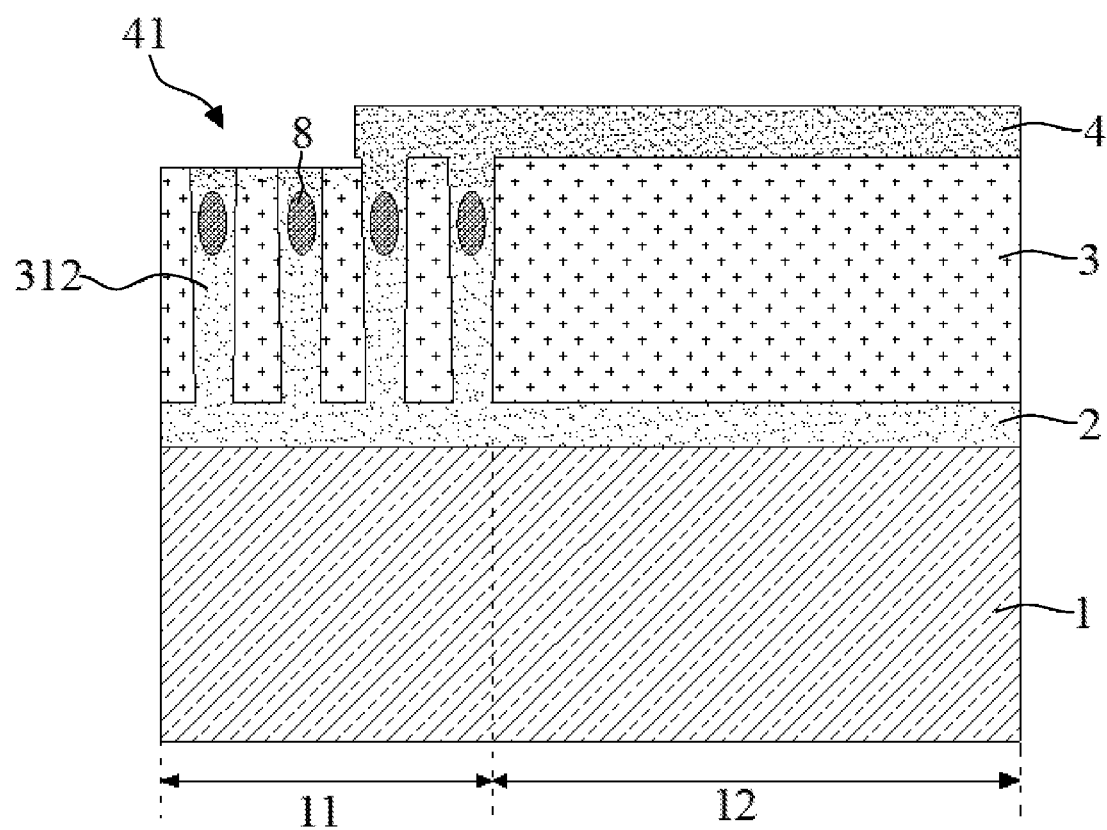
FIG. 14 is a schematic structural diagram after S1603 is completed in the second embodiment of the disclosure.

As shown in FIG. 12, the second insulating dielectric layer 4 may be etched in the developing area by a plasma etching process to form an etching opening 41, which may expose the first insulating dielectric layer 3 located in the array area 11. It is to be noted that, after the above etching process is completed, the photoresist layer 6 may be removed by cleaning with a cleaning solution or ashing, so that the second insulating dielectric layer 4 is not covered by the photoresist layer 6 any longer. In the first implementation of the disclosure, the structure after S1603 is completed is shown in FIG. 13. In the second implementation of the disclosure, the structure after S1603 is completed is shown in FIG. 14.

As shown in FIG. 3, in S170, the first insulating dielectric layer in the array area is removed to form the contact window.

Figure 15:
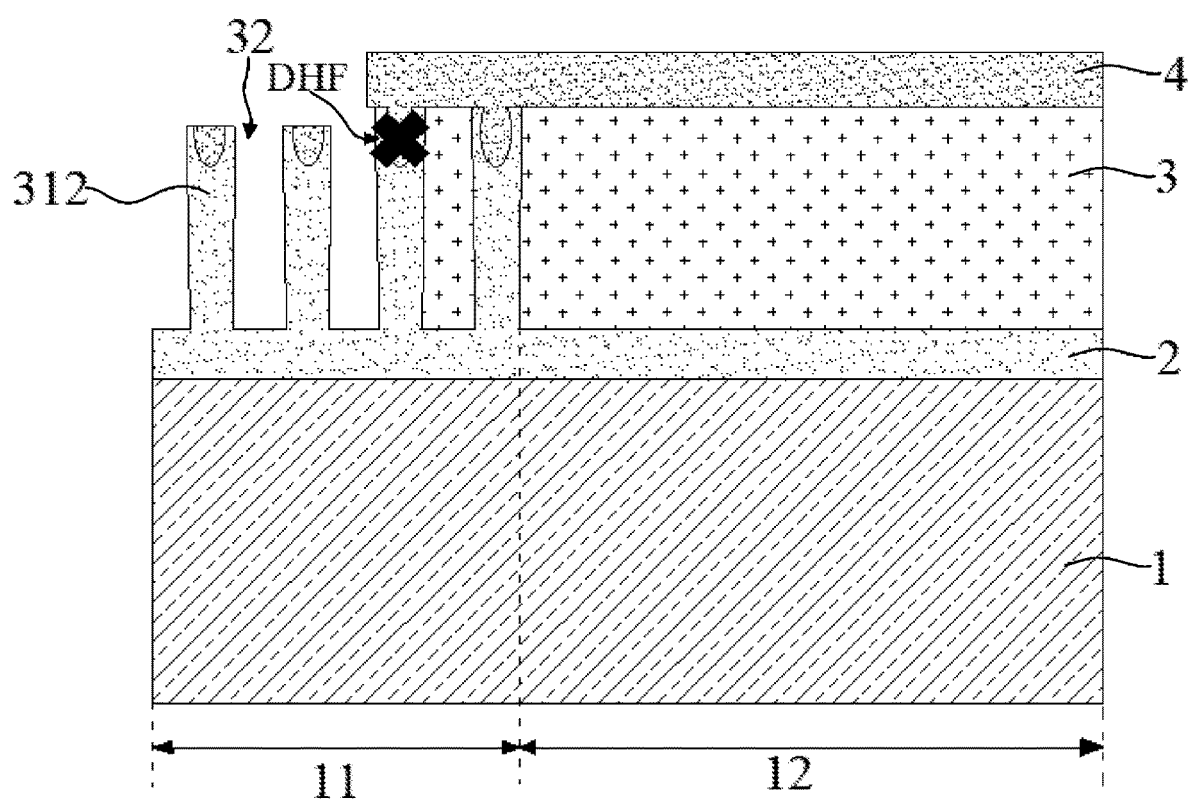
FIG. 15 is a schematic structural diagram after S170 is completed corresponding to FIG. 3.

The first insulating dielectric layer 3 located in the array area 11 may be removed by a wet etching process to form a gap between the isolation structures 312, which may be used as a contact window 32 of capacitance configured to form a capacitive contact structure. In the process, since the second insulating dielectric layer 4 is formed on the top surface of the isolation structure 312, the isolation structure 312 is in contact connection with the second insulating dielectric layer 4. When the first insulating dielectric layer 3 in the array area 11 is removed, the isolation structure 312 and the second insulating dielectric layer 4 may form a barrier structure to prevent the etching solution from entering the peripheral area 12, so as to prevent the etching solution from entering the peripheral area 12, avoid the damage of the structure in the peripheral area 12 by the etching solution, prevent the generation of structural defects and improve the product yield. In an embodiment of the disclosure, the structure after S170 is completed is shown in FIG. 15.

For example, the first insulating dielectric layer 3 located in the array area 11 may be selectively etched with an acidic solution to remove the first insulating dielectric layer 3 located in the array area 11 and retain each isolation structure 312. In an embodiment, the acidic solution may be hydrofluoric acid solution, the material of the first insulating dielectric layer 3 may be silicon oxide, and the materials of the isolation structure 312 and the second insulating dielectric layer 4 are silicon nitride. The silicon oxide of the first insulating dielectric layer 3 may be selectively etched by the hydrofluoric acid solution. Since silicon nitride will not react with the hydrofluoric acid solution, the barrier structure composed of the isolation structure 312 and second insulating dielectric layer 4 will not be damaged during wet etching of the first insulating dielectric layer 3, which may effectively prevent the hydrofluoric acid solution from entering the peripheral area 12 and prevent the structure of the peripheral area 12 from being damaged. At the same time, since it is not necessary to use the photoresist layer 6 to block hydrofluoric acid, the height of the photoresist layer 6 may be reduced, and the manufacturing cost may be reduced.

As shown in FIG. 3, in S180, the second insulating dielectric layer is removed to form the contact material in the contact window.

After the first insulating dielectric layer 3 in the array area 11 is removed, the second insulating dielectric layer 4 may be removed. For example, the remaining second insulating dielectric layer 4 may be removed by a photoetching process or a chemical polishing process. Of course, the second insulating dielectric layer 4 may also be removed by other processes, as long as other film structures are not damaged.

Figure 16:
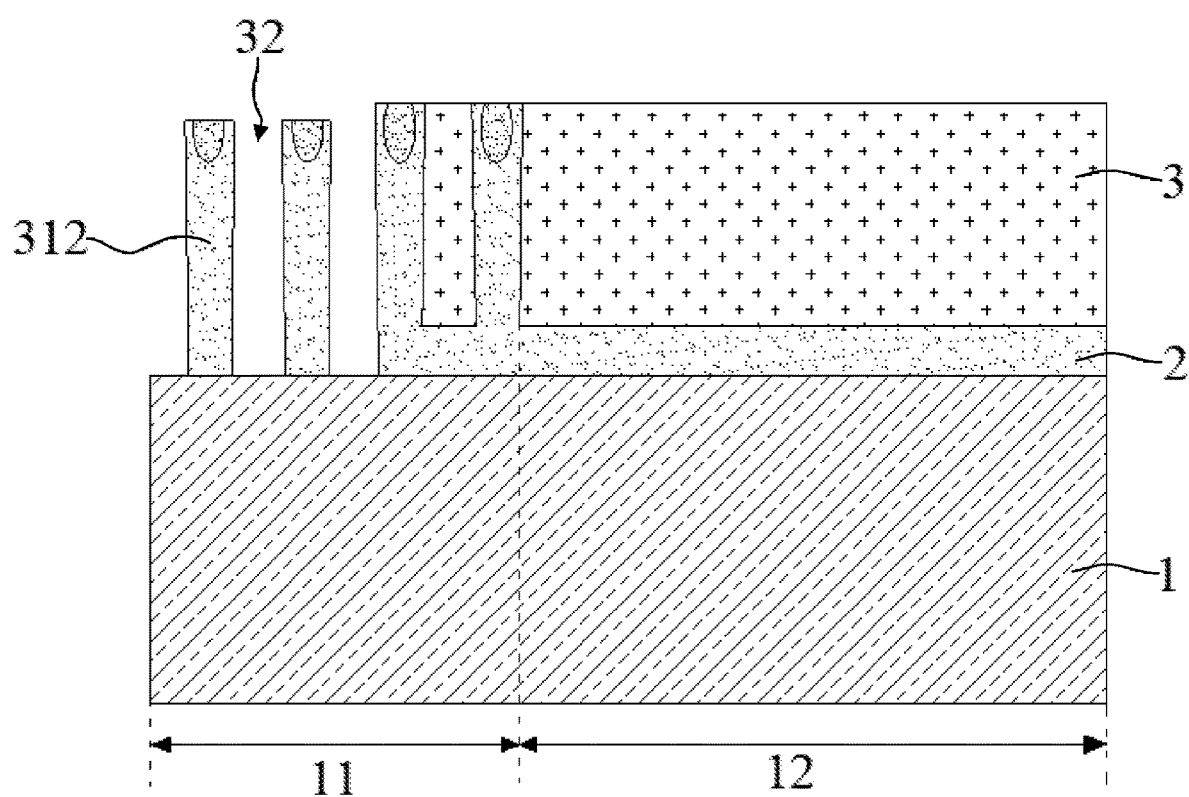
FIG. 16 is a schematic structural diagram after a second insulating dielectric layer is removed in the first embodiment of the disclosure.
Figure 17:
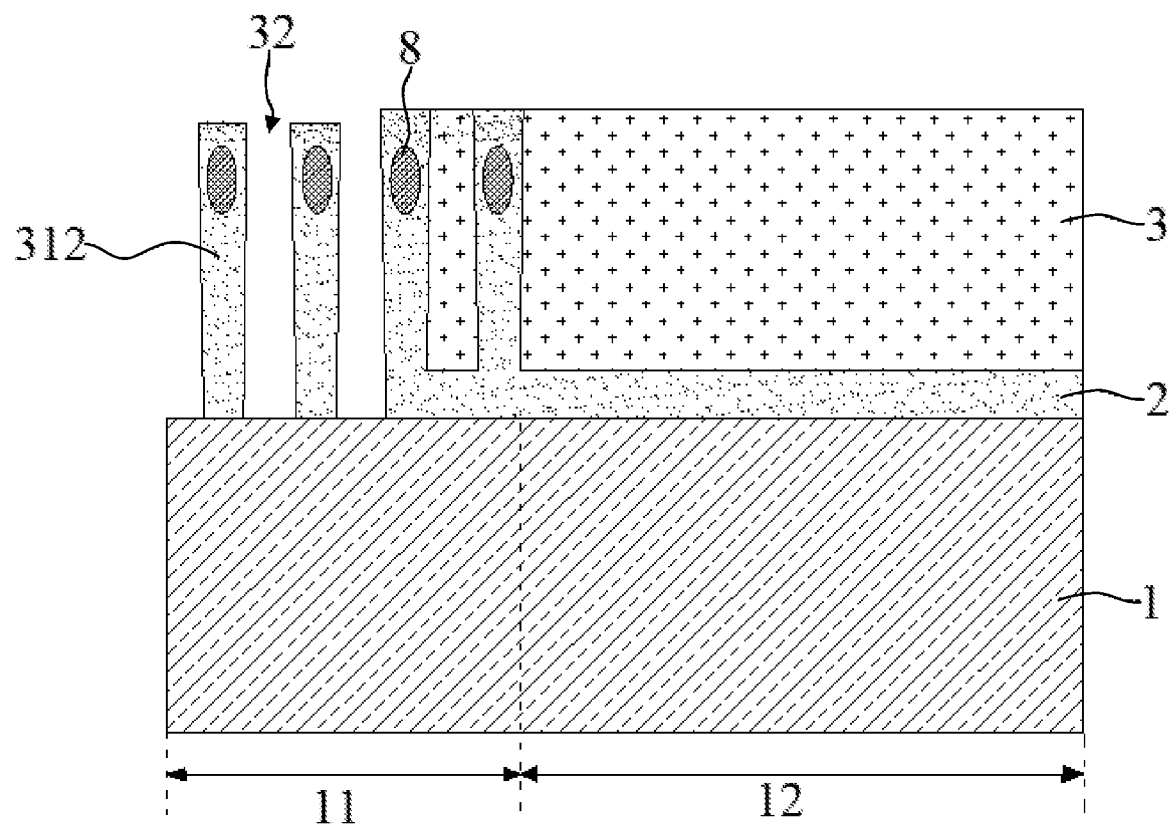
FIG. 17 is a schematic structural diagram after a second insulating dielectric layer is removed in the second embodiment of the disclosure.

It is to be noted that, while the second insulating dielectric layer 4 is removed, the component dielectric layer 2 directly opposite the contact window 32 in the array area 11 may also be removed to expose the substrate 1. In the first embodiment of the disclosure, the structure after removing the second insulating dielectric layer is shown in FIG. 16. In the second embodiment of the disclosure, the structure after removing the second insulating dielectric layer is shown in FIG. 17.

Figure 18:
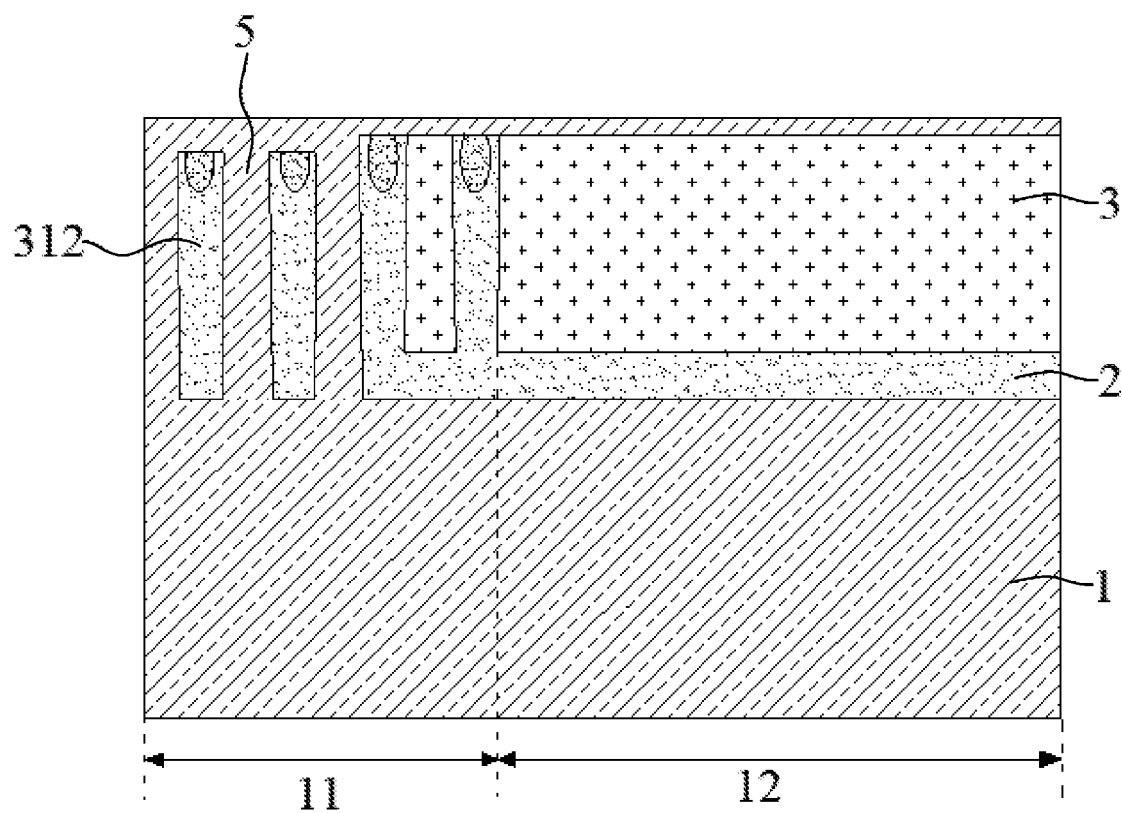
FIG. 18 is a schematic structural diagram after S180 is completed corresponding to FIG. 3.

In an embodiment, the contact material 5 may be deposited in each contact window 32 by atomic layer deposition or chemical vapor deposition. The contact material 5 may be a conductive material, and the conductive material may be in contact connection with the substrate 1 to conduct the capacitance with the source or drain in the substrate 1. For example, the contact material 5 may be polysilicon. In an embodiment of the disclosure, the structure after S180 is completed is shown in FIG. 18.

In an embodiment, the forming method of the disclosure may also include the following operations.

At S190, the surfaces of the first insulating dielectric layer, the contact material and the isolation structure away from the substrate are flattened by a chemical polishing process.

Figure 19:
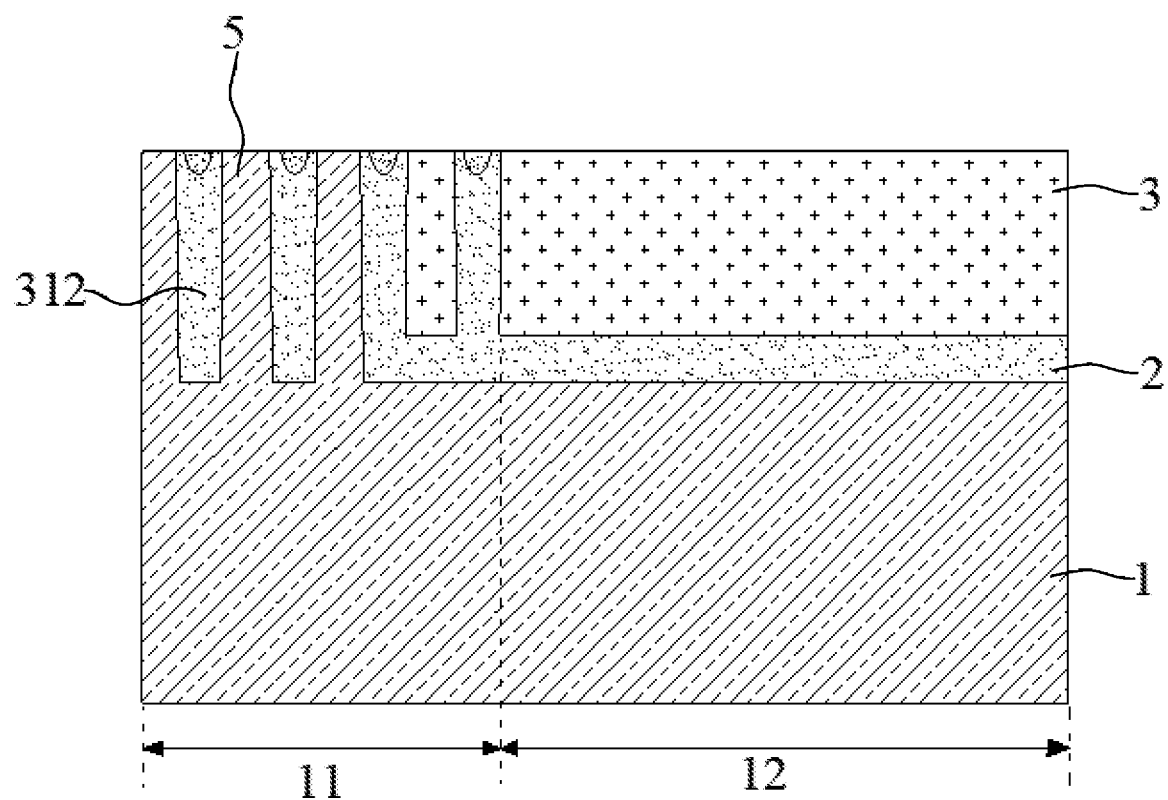
FIG. 19 is a schematic structural diagram after S190 is completed in the first embodiment of the disclosure.
Figure 20:
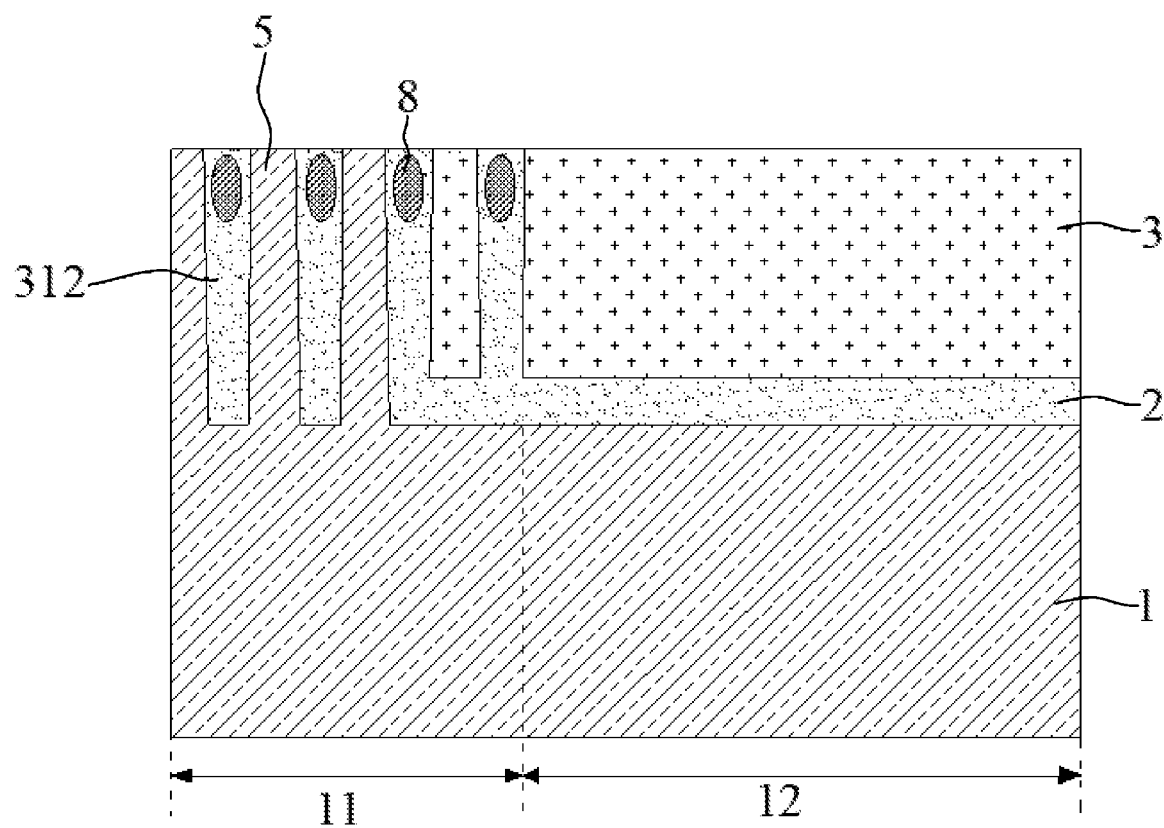
FIG. 20 is a schematic structural diagram after S190 is completed in the second embodiment of the disclosure.

In order to reduce the height difference between the array area 11 and the peripheral area 12, the surfaces of the first insulating dielectric layer 3, the contact material 5 and the isolation structure 312 away from the substrate 1 may be flattened, so that one side of each part, away from the substrate 1, of the isolation structure 312 is at the same height. For example, the surfaces of the first insulating dielectric layer 3, the contact material 5 and the isolation structure 312 away from the substrate 1 may be chemically polished with a polishing solution. The polishing solution may be an acidic solution or, of course, other types of solutions, as long as it may dissolve the excess materials of the first insulating dielectric layer 3, the contact material 5 and the isolation structure 312, and there is no special limitation here. In the first embodiment of the disclosure, the structure after S190 is completed is shown in FIG. 19. In the second embodiment of the disclosure, the structure after S190 is completed is shown in FIG. 20.

In an embodiment, the forming method of the disclosure may also include the following operations.

At S200, the contact material is etched to form a plurality of contact holes, capacitive plugs are respectively formed in each contact hole, and the plurality of contact holes are alternately distributed with the plurality of trenches.

The contact material 5 may be non-isotropically etched to form a plurality of contact holes distributed at intervals, each of which may be alternately distributed with each trench 31. The contact hole may be a blind hole, and its cross section may be circular, rectangular or irregular, which is not specially limited here.

In an embodiment, the plurality of contact holes may be arranged in a row and may be arranged at intervals along the extension direction of the trench 31. Each trench 31 may form a group with each column of contact holes, and a plurality of groups of trenches 31 and contact holes distributed side by side may be formed. In the two adjacent groups, the columns composed of trenches 31 and contact holes are alternately distributed. That is, the contact holes may be distributed on both sides of the trench 31 and may be arranged at intervals along the extension direction of the trench 31.

The capacitive plug 7 may be formed in each contact hole by vacuum evaporation, magnetron sputtering, atomic layer deposition or chemical vapor deposition. The capacitive plug 7 may be composed of a conductive material, and may be configured to achieve contact connection with the capacitor to store charges collected in the capacitor. For example, its material may be tungsten, etc. Specifically, one side, away from the substrate 1, of the capacitive plug 7 may be configured to connect the capacitor, and one side, close to the substrate 1, may be electrically connected to the substrate 1 through the contact material 5 to store the charges collected in the capacitor.

Figure 21:
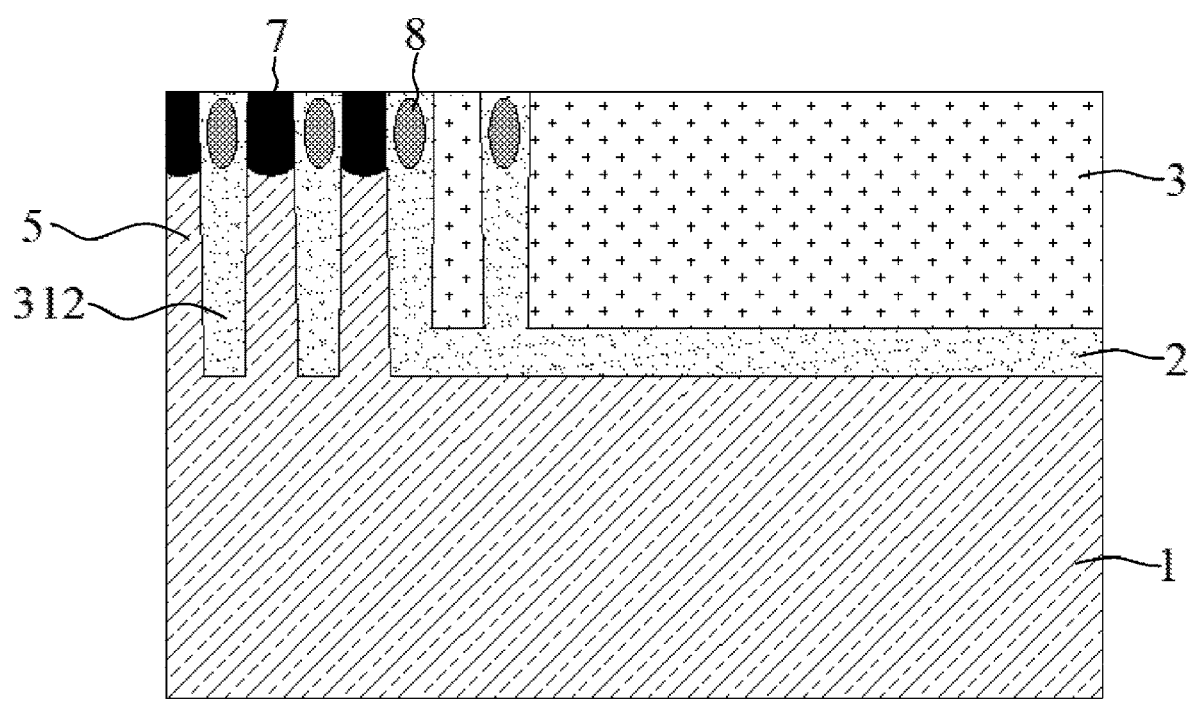
FIG. 21 is a schematic diagram of a capacitive plug in an embodiment of the disclosure.

It is to be noted that, as shown in FIG. 21, each capacitive plug 7 may be arranged alternately with each dielectric layer 8 in each air gap 3111, that is, each capacitive plug 7 may be separated by each dielectric layer 8. Since the dielectric layer 8 is composed of a material with a relatively low dielectric constant, coupling between two adjacent capacitive plugs 7 may be effectively prevented.

The embodiment of the disclosure also provides a semiconductor structure, which may be formed by the forming method of the semiconductor structure of any of the above embodiments. The specific structure and beneficial effects of the semiconductor structure may refer to the forming method of the semiconductor structure in the above embodiments, which will not be elaborated here.

The semiconductor structure may be a storage chip, such as a DRAM, of course, it may also be other semiconductor structures, which will not be listed one by one here.

After considering the specification and practicing the disclosure here, those skilled in the art will easily thick about other implementation schemes of the disclosure. The application aims to contain any modification, purpose or adaptive change of the disclosure, and these modifications, purposes or adaptive changes follow general principles of the disclosure and may include common general knowledge or conventional technical means in the technical field, which is not disclosed by the disclosure. The specification and the embodiments are only considered as examples, and the practical scope and spirit of the disclosure are pointed out by the appended claims.

What is claimed is:

1. A forming method of a semiconductor structure, comprising:
    providing a substrate, the substrate comprising an array area and a peripheral area, and a component dielectric layer being formed on the array area;
    forming a first insulating dielectric layer in the array area and the peripheral area at a same time, and etching the first insulating dielectric layer and the component dielectric layer in the array area to form a plurality of trenches distributed at intervals;
    filling the plurality of trenches with an isolation dielectric material to form a reference isolation structure;
    etching back a portion of the reference isolation structure to form an isolation structure;
    forming a second insulating dielectric layer in the array area and the peripheral area, the second insulating dielectric layer being located on one side, away from the substrate, of the isolation structure and the first insulating dielectric layer;
    patterning the second insulating dielectric layer, and removing the second insulating dielectric layer in the array area to expose the first insulating dielectric layer in the array area;
    removing the first insulating dielectric layer in the array area to form a contact window; and
    removing the second insulating dielectric layer to form a contact material in the contact window.

2. The forming method according to claim 1, wherein patterning the second insulating dielectric layer, and removing the second insulating layer in the array area to expose the first insulating dielectric layer in the array area comprises:

forming a photoresist layer on one side, away from the substrate, of the second insulating dielectric layer;

exposing and developing the photoresist to form a developing area, the developing area exposing the second insulating dielectric layer directly opposite to the array area; and etching the second insulating dielectric layer in the developing area to form an etching opening, the etching opening exposing the first insulating dielectric layer located in the array area.

3. The forming method according to claim 1, wherein removing the first insulating dielectric layer in the array area to form the contact window comprises:

removing the first insulating dielectric layer in the array area by a wet etching process to form the contact window.

4. The forming method according to claim 3, wherein removing the first insulating dielectric layer in the array area by the wet etching process comprises:

removing the first insulating dielectric layer in the array area by using an acidic solution.

5. The forming method according to claim 4, wherein the acidic solution is a hydrofluoric acid solution, and materials of the isolation structure and the second insulating dielectric layer are silicon nitride.

6. The forming method according to claim 1, further comprising:

flattening surfaces of the first insulating dielectric layer, the contact material and the isolation structure away from the substrate by a chemical polishing process.

7. The forming method according to claim 1, further comprising:

etching the contact material to form a plurality of contact holes, and forming capacitive plugs respectively in each contact hole, wherein the plurality of contact holes are alternately distributed with the plurality of trenches.

8. The forming method according to claim 1, wherein each of the plurality of trenches is of a high aspect ratio structure.

9. The forming method according to claim 1, wherein etching back the portion of the reference isolation structure to form the isolation structure comprises:

etching the first insulating dielectric layer and the reference isolation structure to form an isolation structure with air gaps, wherein the second insulating dielectric layer fills the air gaps through openings of the air gaps.

10. The forming method according to claim 1, wherein etching back the portion of the reference isolation structure to form the isolation structure comprises:

etching the first insulating dielectric layer and the reference isolation structure to form an isolation structure with air gaps; and forming a dielectric layer filling the air gaps through the openings of the air gaps, the dielectric layer being composed of a material with high dielectric constant, wherein the first insulating dielectric layer and the dielectric layer are covered by the second insulating dielectric layer.

11. The forming method according to claim 10, wherein the material of the dielectric layer is at least one of following: aluminum oxide, hafnium oxide, lanthanum oxide, titanium oxide, zirconium oxide, tantalum oxide, niobium oxide and strontium oxide.

* * * * *